(12) United States Patent
Russell et al.

(10) Patent No.: US 7,664,763 B1
(45) Date of Patent: Feb. 16, 2010

(54) SYSTEM AND METHOD FOR DETERMINING WHETHER PERFORMING A PARTICULAR PROCESS ON A FILE WILL BE USEFUL

(75) Inventors: Georgina Russell, Mountain View, CA (US); Ravi C. Sundararajan, Los Altos, CA (US)

(73) Assignee: Symantec Operating Corporation, Mountain View, CA (US)

( * ) Notice: Subject to any disclaimer, the term of this patent is extended or adjusted under 35 U.S.C. 154(b) by 441 days.

(21) Appl. No.: 10/738,266

(22) Filed: Dec. 17, 2003

(51) Int. Cl.
*G06F 7/00* (2006.01)
*G06F 17/00* (2006.01)

(52) U.S. Cl. ............................... 707/101; 707/2; 707/3; 707/203; 707/204

(58) Field of Classification Search .................. 707/101, 707/6
See application file for complete search history.

(56) References Cited

U.S. PATENT DOCUMENTS

| | | | | |
|---|---|---|---|---|
| 5,561,421 A | * | 10/1996 | Smith et al. | 341/51 |
| 5,638,498 A | * | 6/1997 | Tyler et al. | 358/1.18 |
| 5,805,932 A | * | 9/1998 | Kawashima et al. | 710/68 |
| 5,813,017 A | * | 9/1998 | Morris | 707/204 |
| 5,956,733 A | * | 9/1999 | Nakano et al. | 707/204 |
| 5,991,515 A | * | 11/1999 | Fall et al. | 358/1.15 |
| 6,289,118 B1 | | 9/2001 | Cossey | 382/162 |
| 6,385,656 B1 | | 5/2002 | Appelman | 709/247 |
| 6,460,044 B1 | | 10/2002 | Wang | 707/101 |
| 6,529,912 B2 | * | 3/2003 | Satoh et al. | 707/101 |
| 6,553,143 B2 | * | 4/2003 | Miyake et al. | 382/239 |
| 6,615,275 B2 | | 9/2003 | Yohe et al. | 709/247 |
| 2001/0019630 A1 | * | 9/2001 | Johnson | 382/232 |
| 2002/0025076 A1 | * | 2/2002 | Yamada | 382/233 |
| 2002/0029206 A1 | * | 3/2002 | Satoh et al. | 707/1 |
| 2002/0078241 A1 | * | 6/2002 | Vidal et al. | 709/247 |
| 2002/0085631 A1 | * | 7/2002 | Engwer | 375/240 |
| 2002/0181586 A1 | * | 12/2002 | Kondo et al. | 375/240.08 |
| 2002/0191692 A1 | * | 12/2002 | Fallon et al. | 375/240 |
| 2003/0002580 A1 | * | 1/2003 | Miura et al. | 375/240.02 |
| 2003/0058873 A1 | * | 3/2003 | Geiger et al. | 370/401 |
| 2003/0072492 A1 | * | 4/2003 | Sugimura et al. | 382/239 |
| 2003/0097474 A1 | * | 5/2003 | Defosse et al. | 709/246 |
| 2003/0149793 A1 | * | 8/2003 | Bannoura et al. | 709/247 |
| 2004/0114195 A1 | * | 6/2004 | Ebner et al. | 358/426.04 |
| 2004/0210608 A1 | * | 10/2004 | Lee et al. | 707/204 |

\* cited by examiner

*Primary Examiner*—Hosain T Alam
*Assistant Examiner*—Usmaan Saeed
(74) *Attorney, Agent, or Firm*—Campbell Stephenson LLP

(57) ABSTRACT

A method involves: performing a first process on a unit of data, where the first process belongs to a class of processes; storing information that identifies a result of performing the first process on the unit of data; and, based on the information, determining whether to subsequently perform a process belonging to the class of processes on the unit of data. For example, the first process can be a compression process used to compress a file before the file is transferred across a network. The information can identify a compression ratio obtained by performing the first process on the file and can be used to determine whether the same compression process (or any compression process in a class of compression processes) should be used to compress the file the next time that the file is to be transferred.

22 Claims, 4 Drawing Sheets

SYSTEM AND METHOD FOR DETERMINING WHETHER PERFORMING A PARTICULAR PROCESS ON A FILE WILL BE USEFUL

FIELD OF THE INVENTION

This invention relates to computer systems and, more particularly, to data storage within computer systems.

BACKGROUND

There are many situations in which it may be useful to perform an action of a file. For example, compressing a data file can reduce the size of a file, making it easier or less costly to transfer the file from one location to another. In general, there are a variety of actions that can be performed on a file. For a given file, some of these actions will be useful, and others will not. For example, one type of compression will reduce the size of a particular file, but another type of compression may not appreciably reduce the size of that file.

One problem that arises with some of the actions is that it may not be possible to determine whether those actions will be useful without actually performing the actions. For example, a user may not be able to efficiently determine whether compressing a file will be useful without actually attempting to compress the file (e.g., while analysis of the file may reveal whether compression is likely to be useful, this analysis may take much longer than simply compressing the file). It is therefore often more clear whether a given action is useful for a given file after the action has been performed on the file. For example, after a file is compressed, the file's size before compression can be compared to the file's size after compression to determine whether the compression was useful. In situations such as these, it is desirable to be able to more easily determine whether performing a process on a file will be useful.

SUMMARY

Various embodiments of systems and methods are disclosed for storing information that indicates whether a particular process (or a particular class of processes) will produce a useful or desirable result on a unit of data. In one embodiment, a method involves: performing a first process on a unit of data, where the first process belongs to a class of processes; storing information that identifies a result of performing the first process on the unit of data; and, based on the information, determining whether to subsequently perform a process belonging to the class of processes on the unit of data. For example, the first process can be a compression process that belongs to a class of one or more compression processes. A file can be compressed, using the first compression process, before being transferred across a network. The information can identify a compression ratio obtained by performing the first process on the file. The information can be used to determine whether the same compression process (or any compression process in a class of compression processes) should be used to compress the file the next time that the file is to be transferred. In one embodiment, the first process is the only process that belongs to the class of processes (i.e., the class of processes consists of the first process).

The foregoing is a summary and thus contains, by necessity, simplifications, generalizations and omissions of detail; consequently, those skilled in the art will appreciate that the summary is illustrative only and is not intended to be in any way limiting. The operations disclosed herein may be implemented in a number of ways, and such changes and modifications may be made without departing from this invention and its broader aspects. Other aspects of the present invention, as defined solely by the claims, will become apparent in the non-limiting detailed description set forth below.

BRIEF DESCRIPTION OF THE DRAWINGS

A more complete understanding of the present invention may be acquired by referring to the following description and the accompanying drawings, in which like reference numbers indicate like features.

Figure 1:
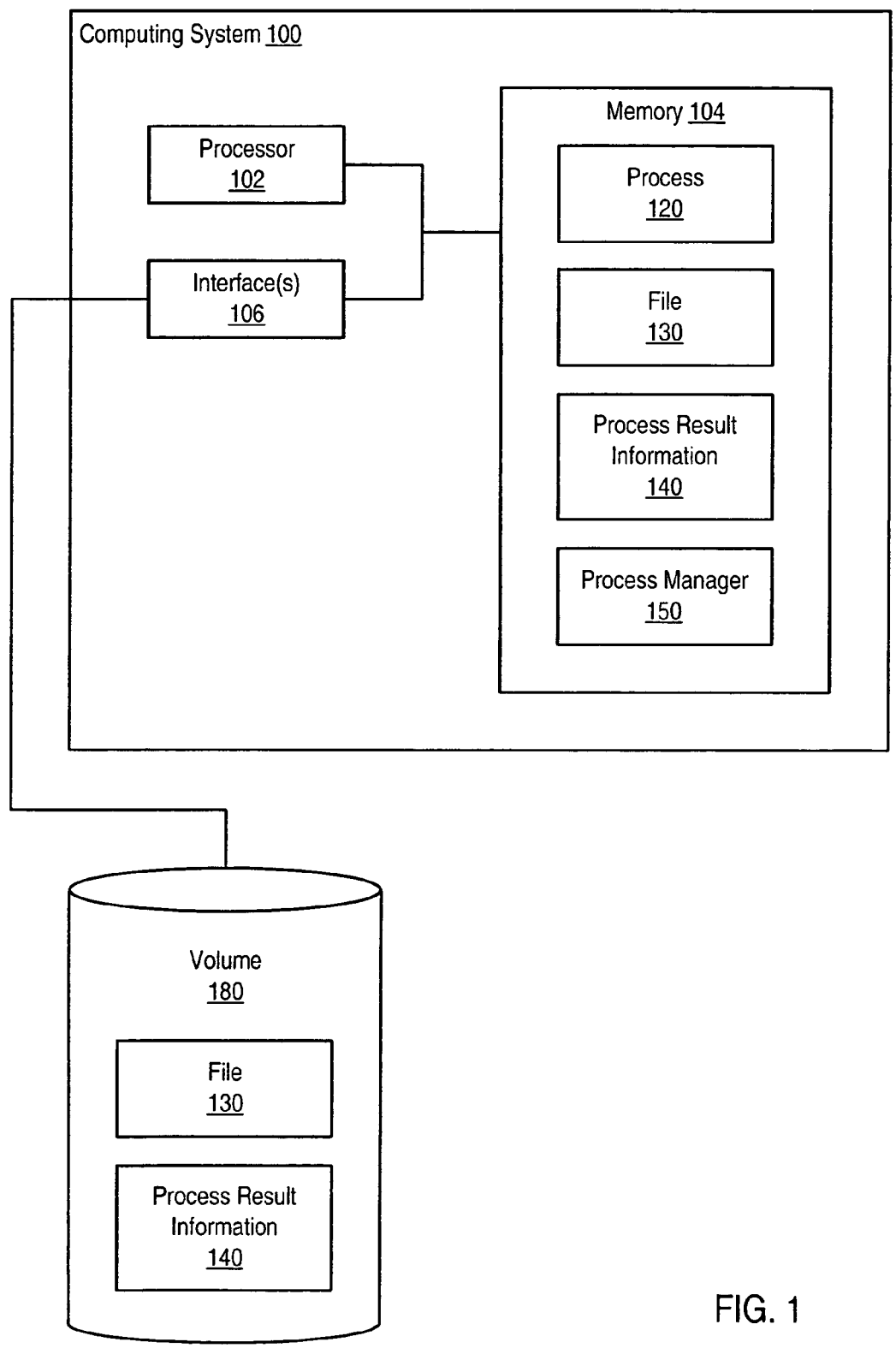
FIG. 1 is a block diagram of a computer system, according to one embodiment of the present invention.

While the invention is susceptible to various modifications and alternative forms, specific embodiments of the invention are provided as examples in the drawings and detailed description. It should be understood that the drawings and detailed description are not intended to limit the invention to the particular form disclosed. Instead, the intention is to cover all modifications, equivalents and alternatives falling within the spirit and scope of the invention as defined by the appended claims.

DETAILED DESCRIPTION

FIG. 1 is a block diagram of a computing system 100. Here, computing system 100 includes processor 102, memory 104, and interface 106, all of which are coupled by a bus or other interconnect. Memory 104 stores data and program instructions that are executable by processor 102 to implement process 120. Memory 104 also stores file 130 and process result information 140. Memory 104 can also store data and program instructions executable by processor 102 to implement process manager 150.

As shown, computing system 100 can be coupled to access data on volume 180. In the illustrated embodiment, computing system 100 accesses volume 180 via interface 106, which can be an interface to a storage area network (SAN) in which volume 180 is included. In other embodiments, volume 180 can be coupled to computing system 100 by a bus (e.g., a SCSI (Small Computer Systems Interface) or PCI (Peripheral Component Interconnect) bus). As shown, copies of various files (such as file 130), data (such as process result information 140), and/or programs can be stored on volume 180. Computing system 100 can read all or part of such files, data, and/or programs into memory 104. Computing system 100 can similarly write all or part of such files, data, and/or programs from memory 104 to volume 180.

Process 120 represents software that performs a process on a unit of data (e.g., a file, a block of data, or the like). Process 120 can be implemented as a sub-routine, procedure, function, plug-in, applet, servlet, or simply as a portion of code within a larger application. Performing a process on a unit of data may involve manipulating, analyzing, modifying, generating information, or the like, based on that unit of data. In one embodiment, process 120 is a compression utility that compresses a file (or a portion of a file) by applying one or more compression algorithms to that file. Such compression algorithms can be specific to a particular type of file (e.g., such as JPEG (Joint Photographic Experts Group) compression for image files or MPEG (Moving Picture Experts Group) compression for video files) or applicable to any type of file (e.g., such as those used by utilities that compress files into formats such as ZIP, SIT, and RAR).

In some embodiments, process 120 belongs to a class of one or more processes. The class of processes includes processes that all perform a similar function or functions on units of data. Each process in the class uses a different technique to perform that particular function. For example, in one embodiment, process 120 is one of several compression processes used by a file system or backup utility. Each of the compression processes operates to compress files, but each compression process implements a different compression algorithm.

File 130 is a group of bytes that are grouped in some accepted manner (e.g., identified by a common file name). File 130 can be one of various different types of files and can include various types of data. For example, file 130 can be a document that is edited using a word processing program. Such a document can include text and formatting information, as well as embedded images or other information. Similarly, file 130 can be a spreadsheet file. File 130 can be, for example, a multimedia file that includes sound and/or image data. File 130 can also be an executable program file in some embodiments. Depending on its type, file 130 can include data records, text, rows and columns of cells, pixels, digitized sound waves, image vectors, video frames, machine language, and/or other information.

Process result information 140 describes the result obtained by performing process 120 on a unit of data. In this example, the unit of data is all or part of file 130. A result can include, for example, the creation a new version of file 130 that has (or lacks) a desired characteristic (e.g., smaller size). For example, if process 120 is a compression process, process result information 140 can include information describing whether and/or how much process 120 was able to compress file 130 or a portion of file 130.

In some embodiments, process result information 140 includes a simple indication as to whether performing process 120 on a unit of data such as file 130 produced a useful result, according to a pre-defined standard of usefulness. In other embodiments, process result information 140 includes data quantifying a result of performing process 120 on the unit of data. Such process result information 140 can later be processed to determine whether the result was a useful result, according to a particular standard of usefulness.

Process result information 140 can include information that quantifies one or more results obtained by performing process 120 on at least a portion file 130. For example, if process 120 is a compression process, process result information 140 can specify the compression ratio (of post-compression size to pre-compression size) obtained by performing process 120 on all or part of file 130.

In some embodiments, process result information 140 is stored as part of existing metadata associated with file 140. For example, process result information 140 can be stored as part of an inode that locates file 130 within volume 180. Alternatively, process result information 140 can be stored in a file accessed by process manager 150. In addition to including process result information 140 associated with file 130, such a file could include process result information associated with other files. In some embodiments, process result information 140 is stored in file 130 itself.

In many embodiments, the creation and use of process result information 140 is automated. For example, process manager 150 can cause process 120 to be performed on various files, such as file 130. After causing process 120 to be performed on file 130 (or one or more portions of file 130), process manager 150 generates and stores process result information 140 to describe one or more results of the performance of process 120 on file 130. If process 120 is performed separately on several different portions of file 130, process manager 150 can store different process result information 140 for each different portion of file 130. Later, process manager 150 can access process result information 140 in order to make a determination as to whether process manager 150 should cause process 120 to be performed on file 130 again.

Process manager 150 can generate process result information 140 based on information obtained from process 120 and/or based on information obtained by accessing file 130 and/or a version of file 130 produced by performing process 120 on file 130. In some embodiments, process manager 150 determines whether performing process 120 on file 130 generated a useful result (according to some standard that defines "usefulness") and generates process result information 140 based on this determination.

In some embodiments, process manager 150 can also store other information as part of process result information 140. For example, process manager 150 can include information identifying the particular version of file 130 on which process 120 was performed. Similarly, process manager 150 can store information identifying the time at which process 120 was performed on file 130 and the size of file 130 at that time. Process manager 150 can also store information identifying the last time at which file 130 (or a relevant portion of file 130, if process 120 is performed on portions of files) was modified. If process manager 150 is later determining whether to perform process 120 on file 130, process manager 150 can use this information to determine whether file 130 has been modified since the last time process 120 was performed on file 130. If file 130 has been modified, process manager 150 may determine that it is worthwhile to perform process 120 on file 130 again, regardless of the usefulness of the result obtained the last time file 130 was processed. If instead process manager 150 detects that file 130 has not been modified subsequent to the time at which process result information 140 was stored, process manager 150 can determine whether or not to cause process 120 to be performed on file 13 based on whether process result information 140 indicates that the last result was useful.

Each time process 120 is performed on file 130, process result information 140 can be updated to describe the result of performing process 120 on file 130. In some embodiments, process result information 140 describes the most recent result. In other embodiments, several results are described in process result information 140. For example, process manager 150 can average data describing the most recent result with data describing one or more previous results and store the average in process result information 140. Alternatively, process manager 150 can add data describing the most recent result to a list (included in process result information 140) that includes data describing each of several previous results.

Once process 120 has been performed on file 130 and information describing the result has been stored in process result information 140, process manager 150 can use process result information 140 when determining whether to perform process 120 (or any other process within the same class of processes as process 120) on file 130 again. Thus, if process result information 140 describes a useful or desirable result (e.g., a result that meets or exceeds certain standards), process manager 150 can choose to perform process 120, or another process within the same class of processes as process 120, on file 130 again. If instead process result information 140 describes a result that is not desirable or useful, process manager 150 can choose to not perform process 120 on file 130 again. In one embodiment, if the latter situation arises, process manager 150 also chooses to not perform any process from the same class of processes as process 120 on file 130 again.

In some embodiments, process manager 150 uses a dynamic standard to determine whether to perform process 120 on file 130 based on process result information 140. For example, in embodiments in which process 120 is a compression process that is performed to compress files that are being copied across a network (e.g., in a system such as the one shown in FIG. 3), process manager 150 can track network usage and/or processor usage (or access other information indicative of network and/or processor usage). During periods in which network usage is relatively high, process manager 150 can choose to compress file 130 if process result information 140 indicates that a compression ratio of less than or equal to 90% was obtained the last time file 130 was compressed. During periods in which network usage is relatively low and processor usage is relatively high, process manager 150 can instead choose to compress file 130 if process result information 140 indicates a compression ratio of 65% or less. Thus, process manager 150 can dynamically determine what the standard(s) for a "useful" or "desirable" result are and can determine whether or not to perform process 120 on file 130 based on whether process result information 140 describes a result that meets or exceeds the current standard(s) for identifying a "useful" or "desirable" result.

In addition to (or instead of) tracking the amount of processor and/or network usage, process manager 150 can track the current cost of processor and/or network usage. For example, network usage can cost different amounts at different times of day or different amounts depending on the current usage of the network. Similarly, in utility computing, processing can have differing costs, depending on the current time and/or the current processor utilization. Accordingly, process manager 150 can take resource cost into account when deciding whether to compress a file. If, for example, network cost is currently lower than average and if process result information 140 indicates that a compression ratio of only 95% was obtained the last time process 120 was performed on file 130, process manager 150 can determine not to compress file 130 before transferring a copy of file 130 across the network. If instead network costs are abnormally high, process manager 150 can decide to compress file 130 before transfer (e.g., if file 130 is large, a 5% reduction in size may provide a significant savings on network costs).

In some embodiments, process manager 150 is part of the same application as process 120. Alternatively, process manager 150 can be part of an application that interacts with process 120. For example, process manager 150 can be part of an application that interfaces with process 120 (e.g., process 120 can be a plug-in used by the application that includes process manager 150).

Figure 2:
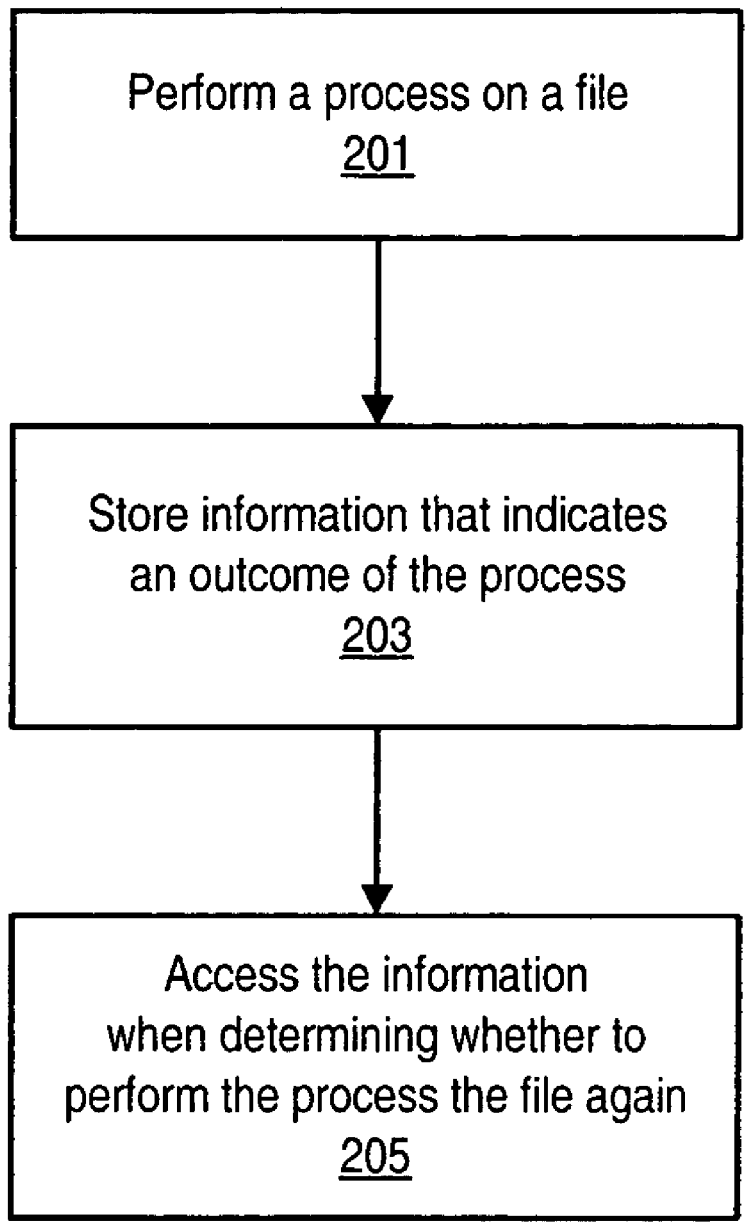
FIG. 2 is a flowchart showing how information can be stored for use when determining whether to perform a particular process on a file, according to one embodiment of the present invention.

FIG. 2 is a flowchart showing how information can be stored for use when determining whether to perform a particular process on a file. At 201, a process is performed on a file or other unit of data (e.g., a portion of a file). Performing the process on the file or other unit of data produces a result, and at 203, information describing this result is stored. The stored information can, for example, describe whether the result was a desired result, based on a particular definition of what a desired result is. The stored information can also (or alternatively) quantify the result. For example, if the process is a compression process, the stored information can identify the size of the file after compression and/or a compression ratio obtained by compressing the file.

It is noted that in some embodiments, the process is performed on different portions of the file at different times. For example, the process can be performed on each fixed- or variable-sized "chunk" (e.g., a group of N blocks) of a file. In such embodiments, functions 201 and 203 can be repeated for each different portion of the file on which the process is performed.

As shown at 205, the stored information can be accessed when determining whether to perform the process on the file (or other unit of data) again. Based on the information, a determination about whether it is worthwhile to perform the process on the file can be made, based on the description of the result obtained the previous time the process was performed on the file. For example, if performing the process is relatively time-consuming or expensive in terms of resources, and if the result described in the stored information is not a desired result (e.g., if the result was of a less than desired magnitude), a determination can be made to not perform the process on the file again. If instead the result described in the stored information is a desired result, a determination to perform the process on the file again can be made.

Figure 3:
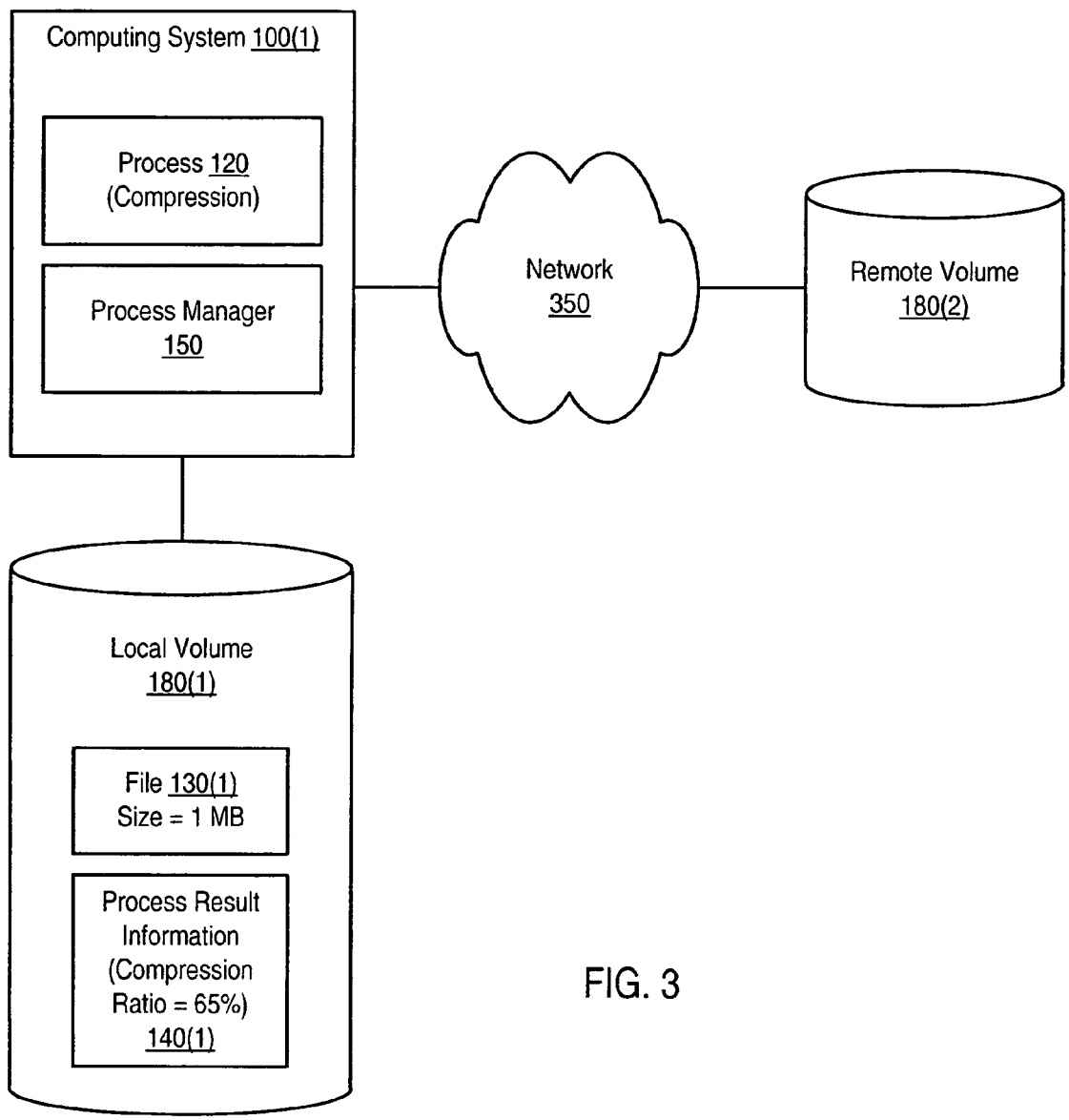
FIG. 3 shows an example of a system in which a stored compression factor is used when determining whether to compress the file, according to one embodiment of the invention.

FIG. 3 shows an example of a system in which process result information is used when determining whether to compress a file or other unit of data. As shown, computing system 100(1) includes process 120, which is a compression process in this example, and process manager 150. Computing system 100(1) is coupled to local volume 180(1), which stores file 130(1) and process result information 140(1). Process result information 140 (1) includes a compression ratio. Computing system 100(1) is also coupled to remote volume 180(2) by network 350.

Process manager 150 transfers a copy of file 130(1) to volume 180(2) via network 350. For example, process manager 150 can be included in a replication or backup utility that copies files from volume 180(1) to volume 180(2). In order to conserve network bandwidth, process manager 150 causes process 120 to compress file 130(1) and then transfers a compressed copy of file 130(1) across the network. In some embodiments, process manager 150 compresses file 130(1) by causing process 120 to be separately performed on each of several different portions of file 130(1) (e.g., process 120 can be a sub-routine that is called once for each different portion of file 130(1)).

Compression may not have a significant effect on certain files. However, performing compression on all of the files to be copied may take a significant amount of time. In order to reduce the amount of time spent performing compression, process manager 150 can use process result information 140 (1) to determine whether compression is likely to be useful for file 130(1). Based on the compression ratio included in process result information 140(1), process manager 150 can determine whether to compress file 130(1) the next time a copy of file 130(1) is to be transferred to volume 180(2). It is noted that in alternative embodiments, similar determinations as to whether a file should be compressed can be performed in situations other than those involving transferring the file across a network.

Accordingly, the first time process manager 150 causes process 120 to be performed on file 130(1), process manager 150 stores process result information 140(1) for file 130(1). The next time process manager 150 copies file 130(1) to volume 180(2), process manager 150 accesses process result information 140(1) and uses process result information 140(1) to determine whether to compress file 130(1) before copying file 130(1) to volume 180(2).

Process manager 150 obtains information for inclusion in process result information 140(1) from process 120 and/or from characteristics of file 130(1) and/or a version of file 130(1) created by process 120. For example, in one embodiment, process 120 provides a compression ratio to process manager 150 after process 120 compresses file 130(1). In other embodiments, process manager 150 obtains the file size of file 130(1) and compares it with the file size of a compressed version of file 130(1). Process manager 150 can store the pre- and post-compression file sizes and/or a ratio of the post-compression file size to the pre-compression file size in process result information 140(1). In the illustrated embodiment, process manager 150 has stored a compression ratio (65% in this example) in process result information 140(1). In some embodiments, process manager 150 can also store a value representing the total time taken to perform process 120 on file 130(1) in process result information 140(1). Process manager 150 can store similar process result information for other files that are copied from volume 180(1) to volume 180(2). Process result information for such other files can be stored in the same file as process result information 140(1) in some embodiments.

In some embodiments, there are several different compression processes, which make up a class of compression processes, that are available to be performed on each file. Process manager 150 can store information describing a result of performing each different compression process on file 130(1) in process result information 140(1) in some embodiments. Process manager 150 can then use this information to select which compression process, if any, from the class of compression processes to perform on file 130(1) the next time file 130(1) is to be transferred across the network. For example, if process result information 140(1) includes result information for several different compression processes, process manager 150 can use this information determine which compression process compressed file 130(1) the most. If that compression process also produced a useful or desirable result when performed on file 130(1), process manager 150 can select that compression process to be performed on file 130(1) the next time process manager needs to transfer file 130(1) across the network.

As noted above, process manager 150 can use a variety of different standards to determine whether to perform process 120 on file 130(1), given process result information 140(1). For example, in one embodiment, process manager 150 only performs process 120 on file 130(1) if process result information 140(1) indicates that a compression ratio of less than or equal to 50% was achieved the last time process 120 was performed on file 130(1). In other embodiments, process manager 150 may dynamically vary its standards depending on the current utilization of and/or performance of network 350. Process manager 150 can use multiple variables (describing usage and/or performance of computing device 100 and/or network 350 and/or obtained from process result information 140(1)) when making its determination. For example, if process result information 140(1) indicates that process 120 took one second to compress file 130(1) by 65%, process manager 150 can make a determination as to whether it is worthwhile to spend one second compressing file 130(1) in order to obtain a 65% compression ratio.

Figure 4:
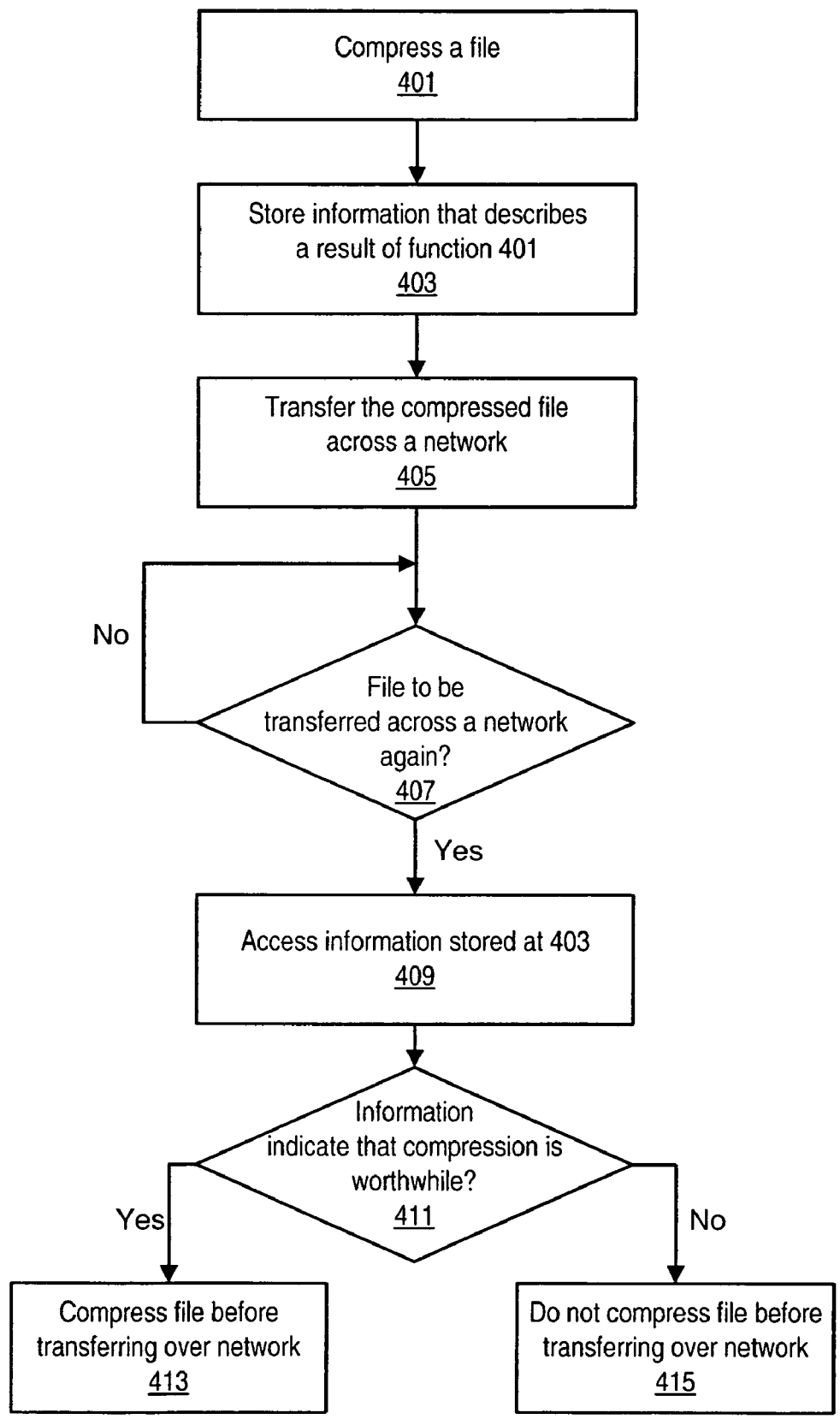
FIG. 4 is a flowchart of a method of generating, storing, and using a compression factor for a file, according to one embodiment of the invention.

FIG. 4 is a flowchart of a process according to one embodiment of the present invention, in which a method of generating, storing, and using process result information for a compression process is described. This method can be performed, for example, during a backup or replication operation in which several files are copied from one volume to another. At 401, a file is compressed. Compressing the file generates a compressed version of the file (the compressed version of the file is saved as a new file in at least some embodiments). Function 401 can represent the first time that the particular file is compressed, or the first time that the particular file is compressed subsequent to having been modified, or simply any time that the particular file is compressed, depending on the embodiment.

Information describing a result of function 401 is stored, as indicated at 403. This information can, for example, include a value representing how long it took to perform function 401, a value indicating a pre-compression size of the file, a value indicating a post-compression size of the compressed version of file, and/or a value indicating the ratio of post-compression to pre-compression file size. The information stored at 403 can also include information that describes the characteristics of the file at the time function 401 is performed. For example, the information stored at 403 can include data that indicates the last time at which the file was modified, prior to the file being compressed.

Storing the information involves storing the information in a memory device (e.g., a register, hard disk, RAM (Random Access Memory), or the like). For example, function 403 can involve writing the information to disk. Alternatively, function 403 can involve the information being temporarily stored within a cache or register internal to a microprocessor. In some embodiments, storing the information involves writing the information to a volatile memory device (e.g., RAM). The length of time during which the information is stored can also vary among embodiments. For example, in some embodiments, the information is stored for less than a second, while in other embodiments, the information is stored for an hour or more.

At 405, the compressed version of the file is transferred across a network. It is noted that functions 403 and 405 can be performed in any order, and that these functions are performed at substantially the same time or during overlapping periods in some embodiments.

If the file is to be transferred across the network again, as detected at 407, the information stored at 403 can be used to determine whether the file should be compressed before it is transferred, as shown at 411. If the stored information indicates that compressing the file will be useful, as determined at 411, the file will be compressed and the compressed version will then be transferred over the network, as indicated at 413. Otherwise, the file will not be compressed before transfer, as shown at 415.

The stored information can indicate whether the compression will be useful in a variety of ways. For example, an application that is determining whether to compress the file can compare one or more values (e.g., compression ratios, pre- and post-compression file sizes, time required to compress the file, and the like) included in the information stored at 403 to respective values, which define a "useful" standard of compression, in order to determine how effective the compression was the last time it was performed on the file (e.g., at 401). Based on the effectiveness of the compression performed at 401, the application can determine whether it will be worthwhile to perform the compression again. For example, if the compression performed at 401 only compressed the file to 95% of its original size, and the compression took several seconds to perform, and if the definition of a useful standard of compression specifies a compression ratio less than 80% and a performance time of less than 1 second, the application can determine that it is not worthwhile to compress the file again. Consequentially, the application will not compress the file before transferring the file over the network. If instead the information stored at 403 indicates that the compression process compressed the file to 45% of its original size and took a 0.5 seconds to perform and the same standards for useful compression are applied, the application can determine that it is worthwhile to perform compression on that file again.

Returning to FIG. 1, it is noted that processor 102 can be a microprocessor, PLD (Programmable Logic Device), ASIC (Application Specific Integrated Circuit), or other device configured to execute program instructions stored in memory 104. Memory 104 can include various types of RAM (Random Access Memory), ROM (Read Only Memory), Flash memory, MEMS (Micro Electro-Mechanical Systems) memory, and the like. In alternative embodiments, process 120 and/or process manager 150 are implemented in hardware or in a combination of hardware and software instead of being implemented in software. For example, process 120 can be implemented in an ASIC configured to perform the same functions as the program instructions shown in FIG. 1.

The program instructions and data implementing process 120 and/or process manager 150, as well as the data implementing file 130 and process result information 140, can be stored on various computer readable media such as memory 104. In some embodiments, such software is stored on a computer readable medium such as a CD (Compact Disc), DVD (Digital Versatile Disc), hard disk, optical disk, tape device, floppy disk, and the like). In order be executed by processor 102, the instructions and data implementing process 120 and process manager 150 are loaded into memory 104 from the other computer readable medium. The instructions and/or data can also be transferred to computing system 100 for storage in memory 104 via a network such as the Internet or upon a carrier medium. In some embodiments, a computer readable medium is a carrier medium such as a network and/or a wireless link upon which signals such as electrical, electromagnetic, or digital signals, on which the data and/or instructions implementing process 120, process manager 150, file 130, and/or process result information 140 are encoded, are conveyed.

Although the present invention has been described with respect to specific embodiments thereof, various changes and modifications may be suggested to one skilled in the art. It is intended that such changes and modifications fall within the scope of the appended claims.

What is claimed is:

1. A method comprising:
 transferring a first copy of a file over a network, wherein the first copy of the file is a compressed version of the file;
 storing information associated with the first copy of the file, wherein
  the information describes a result obtained by compressing the file to obtain the first copy of the file;
 determining whether to compress a second copy of the file, wherein the determining comprises
  accessing the information associated with the first copy of the file,
  determining whether the result obtained by compressing the first copy of the file was a desirable or undesirable result, wherein
   a desirable result is one that is useful according to a pre-defined standard of usefulness, and
   an undesirable result is one that is not useful according to the pre-defined standard of usefulness;
 in response to the result being a desirable result:
  selecting to compress the second copy of the file to produce a compressed second copy of the file, and
  transferring the compressed second copy of the file over the network; and
 in response to the result being an undesirable result:
  selecting to not compress the second copy of the file, and
  transferring the second copy of the file over the network.

2. The method of claim 1, wherein the accessing the information comprises:
 accessing a compression ratio.

3. The method of claim 1, wherein the accessing the information comprises:
 accessing a post-compression size of the compressed version of the file.

4. The method of claim 1, wherein the accessing the information comprises:
 accessing a value representing an amount of time taken to compress the file to produce the first copy of the file.

5. The method of claim 1, further comprising:
 repeating the accessing for each of a plurality of compression algorithms; and determining which of the compression algorithms to use to subsequently
 compress the second copy of the file by comparing the information stored for each of the compression algorithms.

6. A system comprising:
 a processor; and
 a memory coupled to the processor and configured to store program instructions executable by the processor to:
  transfer a first copy of a file over a network, wherein the first copy of the file is a compressed version of the file;
 store information associated with the first copy of the file, wherein
  the information describes a result obtained by compressing the file to obtain the first copy of the file;
 access information associated with the first copy of the file,
 determine whether the result obtained by compressing the first copy of the file was a desirable or undesirable result, wherein
  a desirable result is one that is useful according to a pre-defined standard of usefulness, and
  an undesirable result is one that is not useful according to the pre-defined standard of usefulness;
 in response to the result being a desirable result:
  select to compress a second copy of the file to produce a compressed second copy of the file, and
  transfer the compressed second copy of the file over the network; and
 in response to the result being an undesirable result:
  select to not compress the second copy of the file, and
  transfer the second copy of the file over the network.

7. The system of claim 6, wherein the information comprises a compression ratio.

8. The system of claim 6, wherein
 the information comprises a post-compression size of the compressed version of the file.

9. The system of claim 6, wherein
 the information comprises a value representing an amount of time taken to compress the file to produce the first copy of the file.

10. The system of claim 6, wherein the program instructions are executable to:
 access information for each of a plurality of compression algorithms; and determine which of the compression algorithms to use to subsequently compress the second copy of the file by comparing the information stored for each of the compression algorithms.

11. A computer program product comprising:
a computer readable storage medium comprising program instructions executable to:
   transfer a first copy of a file over a network, wherein
      the first copy of the file is a compressed version of the file;
   store information associated with the first copy of the file, wherein
      the information describes a result obtained by compressing the file to obtain the first copy of the file;
   access the information associated with the first copy of the file,
   determine whether the result obtained by compressing the first copy of the file was a desirable or undesirable result, wherein
      a desirable result is one that is useful according to a pre-defined standard of usefulness, and
      an undesirable result is one that is not useful according to the pre-defined standard of usefulness;
   in response to the result being a desirable result:
      select to compress a second copy of the file to produce a compressed second copy of the file, and
      transfer the compressed second copy of the file over the network; and
   in response to the result being an undesirable result:
      select to not compress the second copy of the file, and
      transferring the second copy of the file over the network.

12. The computer program product of claim 11, wherein the information comprises a compression ratio.

13. The computer program product of claim 11, wherein the information comprises a post-compression size of the compressed version of the file.

14. The computer program product of claim 11, wherein the information comprises a value representing an amount of time taken to compress the file to produce the first copy of the file.

15. The computer program product of claim 11, wherein the program instructions are executable to:
   access information stored for each of a plurality of compression algorithms; and
   determine which of the compression algorithms to use to subsequently compress the second copy of the file by comparing the information stored for each of the compression algorithms.

16. A system comprising:
computer-readable storage means for storing information associated with a file;
means for transferring a first copy of a file over a network, wherein
   the first copy of the file is a compressed version of the file;
means for storing information associated with the first copy of the file, wherein
   the information describes a result obtained by compressing the file to obtain the first copy of the file;
means for determining whether to compress a second copy of the file, wherein the means for determining comprises
means for accessing the information associated with the first copy of the file,
means for determining, whether the result obtained by compressing the first copy of the file was a desirable or undesirable result,
   wherein a desirable result is one that is useful according to a pre-defined standard of usefulness, and
   an undesirable result is one that is not useful according to the pre-defined standard of usefulness;
in response to the result described being a desirable result:
   means for selecting to compress the second copy of the file to produce a compressed second copy of the file, and
   means for transferring the compressed second copy of the file over the network; and
in response to the result being an undesirable result:
   means for selecting to not compress the second copy of the file, and
   means for transferring the second copy of the file over the network.

17. The system of claim 16, wherein the information comprises a compression ratio.

18. The system of claim 16, further comprising:
means for performing a compression process on the file, and
means for performing an additional compression process on the file, wherein the information also identifies a result obtained by performing the additional compression process on the file, and
the means for determining uses the information to select which of the compression process and the additional compression process to subsequently perform on the second copy of the file.

19. The method of claim 1, wherein an inode associated with the file comprises the information.

20. The method of claim 1, wherein the information identifies a time at which the file was compressed to obtain the result.

21. The method of claim 20, further comprising:
determining whether the file has been modified subsequent to the time; and
in response to the determining that the file has been modified subsequent to the time, selecting to compress the second copy of the file, regardless of whether the result is a desirable result.

22. The method of claim 1, further comprising:
determining whether the result is the desirable result, based upon current usage of a resource, wherein the resource is one of a processor or a network.

* * * * *